(12) United States Patent
Van Velzen et al.

(10) Patent No.: US 6,229,266 B1
(45) Date of Patent: May 8, 2001

(54) VOLTAGE LEVEL INDICATOR

(75) Inventors: Jeroen Van Velzen; Coen T. H. F. Liedenbaum, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/313,546

(22) Filed: May 14, 1999

(30) Foreign Application Priority Data

May 18, 1998 (EP) .................................................. 98201608

(51) Int. Cl.$^7$ ...................................................... G09G 3/10
(52) U.S. Cl. ............................................ 315/169.3; 345/76
(58) Field of Search .......................... 315/169.1, 169.2, 315/169.3, 169.4; 345/76

(56) References Cited

U.S. PATENT DOCUMENTS

| | | | |
|---|---|---|---|
| 4,141,002 | * | 2/1979 | Reinhold ................................ 345/36 |
| 4,275,403 | * | 6/1981 | Lebailly ................................. 257/91 |
| 5,828,181 | * | 10/1998 | Okuda ................................ 315/169.3 |
| 5,866,474 | * | 3/1999 | Asai et al. ........................ 315/169.1 |
| 5,873,760 | * | 2/1999 | Wei et al. .............................. 445/24 |
| 5,877,695 | * | 3/1999 | Kubes et al. ...................... 340/815.4 |
| 5,902,689 | * | 5/1999 | Vleggaar et al. .................... 428/690 |
| 5,982,345 | * | 11/1999 | Takayama et al. ..................... 345/76 |

OTHER PUBLICATIONS

"LED Display's", Katalogus Display Electronika 1995, p. 1–67 and 9–5.*

* cited by examiner

Primary Examiner—Don Wong
Assistant Examiner—Ephrem Alemu
(74) Attorney, Agent, or Firm—Aaron Waxler

(57) ABSTRACT

Integrated voltage level indicator comprising a plurality of polymer LEDs between two contact leads, in which the number of luminescing LEDs and/or the intensity of the light in each LED is determined by the external voltage level.

7 Claims, 6 Drawing Sheets

VOLTAGE LEVEL INDICATOR

BACKGROUND OF THE INVENTION

The invention relates to a display device comprising a plurality of electroluminescent diodes and means for causing one or more of the diodes to luminesce in dependence upon a voltage to be supplied between two connection points.

Electroluminescent (EL) or light-emitting display devices of this type may be used in, for example displays and level indicators for checking battery voltages, and as voltage meters in, for example shavers, portable telephones, for output power display in audio applications, etc.

Such level indicators are generally known and comprise a plurality of juxtaposed light-emitting diodes (LEDs) with the voltage supplied to the above-mentioned connection points determining the number of LEDs which luminesces. Such a circuit comprises a plurality of LEDs, each in its own housing, which are arranged on a printed circuit board so as to work together functionally. The supplied voltage is converted via an A/D converter into a digital value; the number of diodes to be energized is determined via a second IC (or via integration in the A/D converter).

The costs of placing and mounting said components are generally high. Moreover, the printed circuit requires extra space and covers a considerable part of the volume, particularly in the case of portables.

SUMMARY OF THE INVENTION

It is, inter alia, an object of the invention to obviate one or more of the above-mentioned problems.

To this end, a display device according to the invention is characterized in that at least the electroluminescent diodes are integrated in one semiconductor body.

Such an integration of the diodes reduces the costs of placement and generally reduces the number of connections to be provided.

A preferred embodiment of the display device is characterized in that the electroluminescent diodes comprise a layer of electroluminescent material with a common active layer of an organic material, which layer is present between a first and a second pattern of electrodes, at least one of the two patterns being transparent to light to be emitted by the active layer, and the first pattern comprising a material which is suitable for injecting charge carriers.

Organic materials such as, for example, semiconducting organic polymers are used for the active layer. This increases the number of possible materials for use in these types of display devices. The active layer and the two electrode layers jointly constitute a plurality of LEDs, for example, in the form of light-emitting surfaces which are arranged side by side. The operation is based on the recombinations of electron hole pairs which are injected into the semiconductor material (during use in the forward direction) from electrodes located on both sides of the active layer. Due to these recombinations, energy in the form of (visible) light is released, which is a phenomenon referred to as electroluminescence. The wavelength and hence the color of the emitted light are also determined by the band gap of the (semiconductor) material.

To cause the juxtaposed light-emitting surfaces to function as a level indicator, for example, the threshold voltage for each branch comprising a LED is different so that, with an increasing voltage, an increasing number of surfaces lights up. This discriminating power can be realized in different ways.

A first embodiment of a display device according to the invention is therefore characterized in that the electroluminescent diodes are arranged in parallel branches and are provided with mutually different series resistors in the parallel branches.

Since different diodes now have at least one connection in common, the total number of connections to be provided is reduced.

The display device preferably comprises parallel resistors arranged parallel to the electroluminescent diodes, or the electroluminescent diodes are provided with mutually different series resistors between the electroluminescent diodes and a voltage divider.

In both cases, the discriminating power of the level indicator is increased. A further improvement is obtained by using an optical filter.

Said resistors are preferably integrated in the same semiconductor body, for example, by dimensioning the connection tracks which are preferably made of the same transparent material (for example, indium-tin-oxide) as the transparent electrodes.

Instead of the above-described resistive discrimination, frequency discrimination is alternatively possible. A display device according to the invention, based on this principle, is characterized in that the display device comprises a voltage-controlled oscillator arranged between a connection point and the part of the parallel branches which is common for the series resistors.

These and other aspects of the invention are apparent from and will be elucidated with reference to the embodiments described hereinafter.

DESCRIPTION OF THE DRAWINGS

In the drawings:

FIG. 10 shows luminance/voltage characteristics of the electroluminescent diodes in FIG. 9, while

The Figures are diagrammatic and not to scale. Corresponding elements are generally denoted by the same reference numerals.

FIG. 1 is a bottom view and FIG. 2 is a cross-section of a part of a display device 1 consisting, in this embodiment, of an active layer 2 between two electrode layers 3, 4 of electrically conducting materials, provided on a surface 5 of a transparent substrate 6 of, for example, glass or synthetic material. The active layer 2 may comprise a polymer material or a low-molecular organic material (OLEDs), which material is generally provided by means of vapor deposition.

Figure 1:
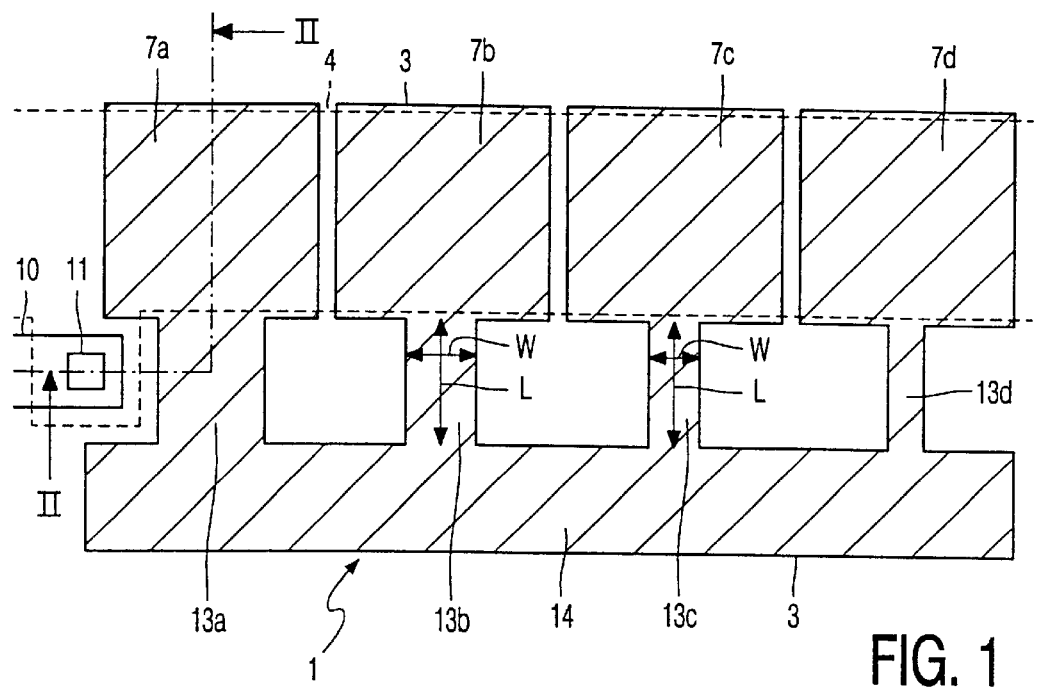
FIG. 1 is a diagrammatic bottom view of a part of a display device according to the invention.
Figure 2:
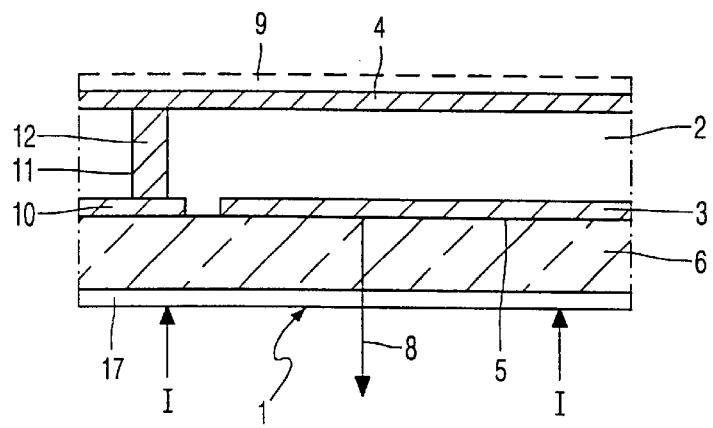
FIG. 2 is a diagrammatic cross-section taken on the line II—II in FIG. 1.

In this way, light-emitting diodes (LEDs) 7 are formed with the intermediate active material at the area of crossings of the electrode layers 3, 4. During operation, the LEDs 7 emit light transverse to the surface 5, as is diagrammatically shown by means of arrows 8. The electrode 3 is transparent to the emitted light in the active layer. During operation, the electrode 3 is driven in such a way that it has a sufficiently positive voltage with respect to the electrode 4 for the injection of holes into the active, layer. The material of this electrode 3 has a high work function and is generally constituted by a layer of indium oxide or indium tin oxide (ITO). Particularly ITO is suitable because of its good electrical conductivity and high transparency.

With respect to the electrode 3, the electrode 4 serves as a negative electrode for the injection of electrons into the active layer. The material for this layer is aluminum in this example, but it may be alternatively a material having a low work function, for example, indium, calcium, barium or magnesium. If necessary, the display device is provided with a protective coating 9, shown by way of broken lines, on the side of the electrode layer 4. Alternatively, the layers may be provided in the reverse order.

The electrode 4 is contacted by means of connections 10 at the lower side (light-emitting side) via contact holes 11 through the active layer 2. For the sake of easy processing, the connections 10 are preferably made of the same material as the electrodes 3. The material 12 in the contact holes II may be ITO or aluminum, or any other material used for the electrode layers 3, 4.

As already noted, light-emitting (electroluminescent) diodes (LEDs) 7, four LEDs $7^a$, $7^b$, $7^c$, $7^d$ in the embodiment shown in FIG. 1, are formed together with the intermediate active material 2 at the area of crossings of the electrode layers 3, 4. The other part of the electrode layer 3 does not cross the electrode layer 4 so that no light is emitted here during operation. This part is dimensioned in such a way that it comprises four series resistors $13^a$, $13^b$, $13^c$, $13^d$ between the LEDs 7 and a connection strip 14 for external connections. The series resistors $13^a$, $13^b$, $13^c$, $13^d$ have such a width/length ratio (w/l) that it increases from left to right (and hence the series resistance) in FIG. 1.

Figure 3:
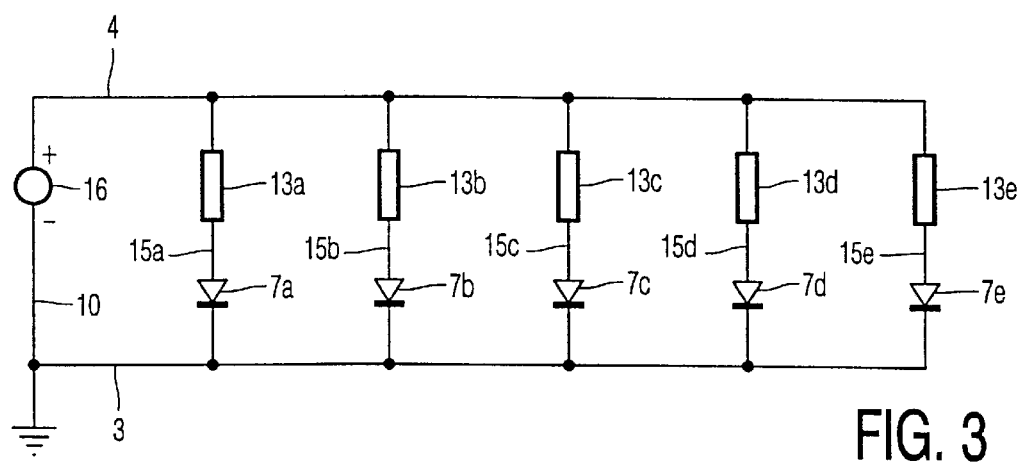
FIG. 3 is an equivalent circuit diagram of the display device shown in FIG. 1.
Figure 4:
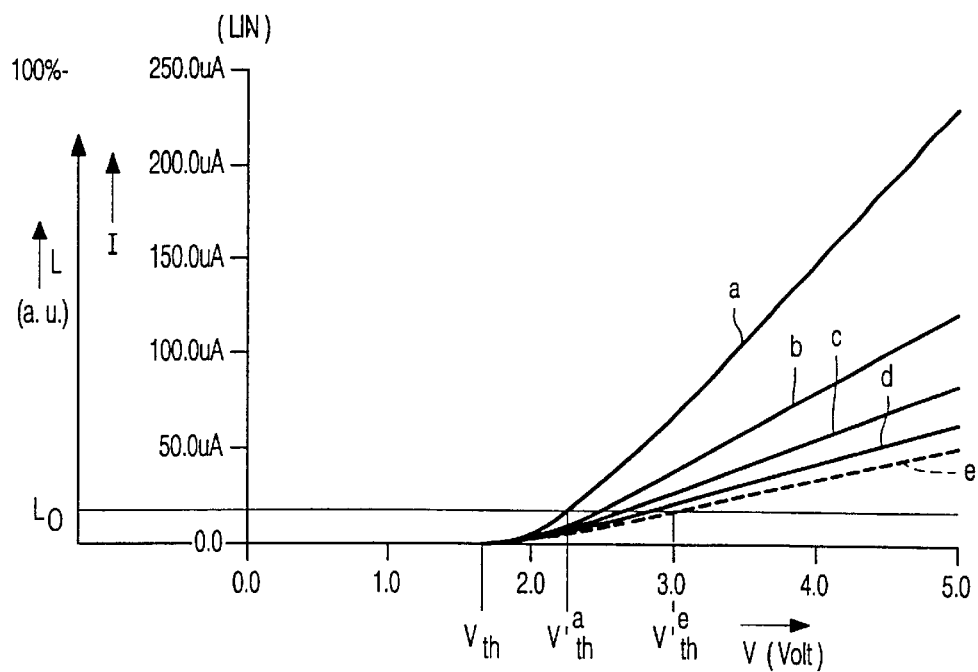
FIG. 4 shows current/voltage characteristics of the electroluminescent diodes in FIG. 3.

FIG. 3 is an equivalent circuit diagram of such a display device with five parallel-arranged LEDs $7^a$, $7^b$, $7^c$, $7^d$, $7^e$, provided with (series resistors) $13^a$, $13^b$, $13^c$, $13^d$, $13^e$, the resistance of which increases again from left to right. FIG. 4 shows the current/voltage characteristics a, b, c, d, e of each branch $15^a$, $15^b$, $15^c$, $15^d$, $15^e$ (the luminance/voltage curve is comparable therewith). From a certain threshold voltage $V_{th}$, all of the five branches conduct. Due to the higher resistance of each subsequent branch, the increase of current through the respective LEDs $7^a$, $7^b$, $7^c$, $7^d$, $7^e$ is smaller at an increasing voltage V of the voltage source 16 in each subsequent branch, but the luminance L nevertheless increases in all LEDs. As a result, all LEDs light up at the threshold voltage $V_{th}$, be it with a different luminance. By providing the display device with an optical filter 17, a part of the light (to a luminance Lo) is attenuated and the LEDs $7^a$, $7^b$, $7^c$, $7^d$, $7^e$ light up from threshold voltages $V'^a_{th}$, $V'^b_{th}$ ... $V'^c_{th}$ which are different for each LED. In this way, the LEDs seemingly extinguish one by one when the voltage of the voltage source 16 decreases (for example, the battery of a shaver).

Figure 5:
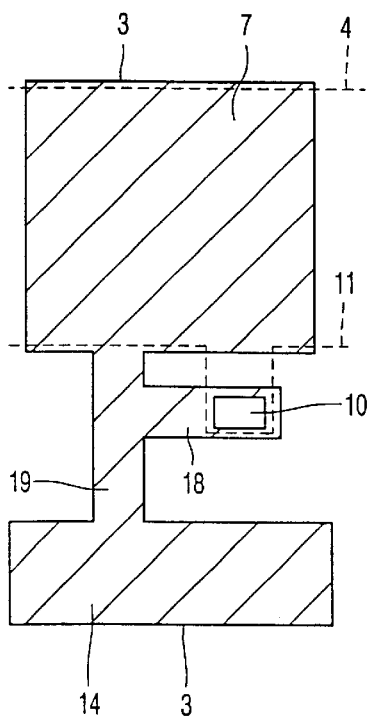
FIG. 5 is a diagrammatic plan view of a part of another display device according to the invention.

FIG. 5 is a plan view of a variant of a part of the display device shown in FIG. 1. The ITO track 18 between the series resistor and a contact hole 10 to the electrode layer 4 constitutes a resistor which is arranged parallel to the LED 7.

Figure 6:
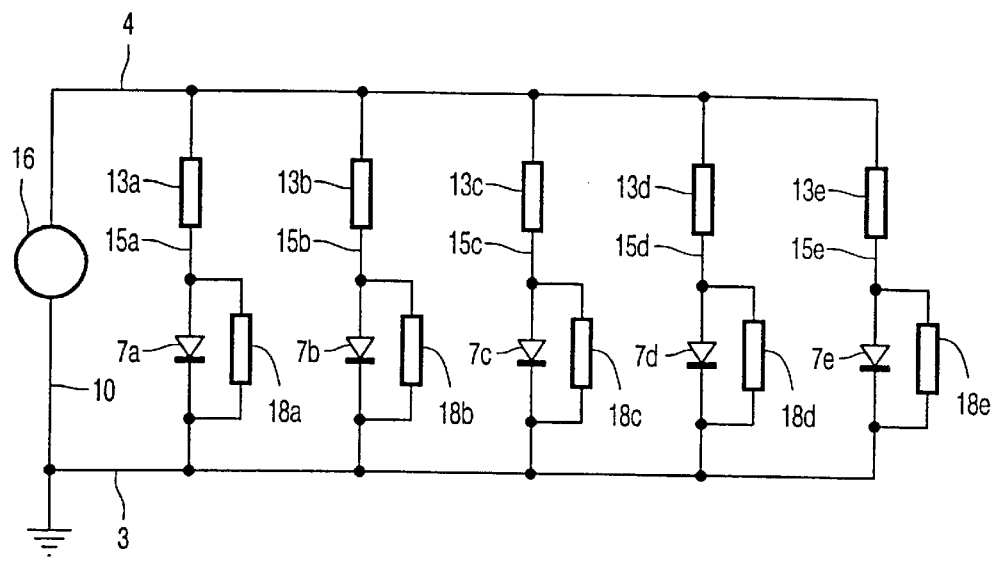
FIG. 6 is an equivalent circuit diagram of the display device shown in FIG. 5, FIGS. 7 and 8 show luminance/voltage characteristics of electroluminescent diodes in FIG. 5.
Figure 7:
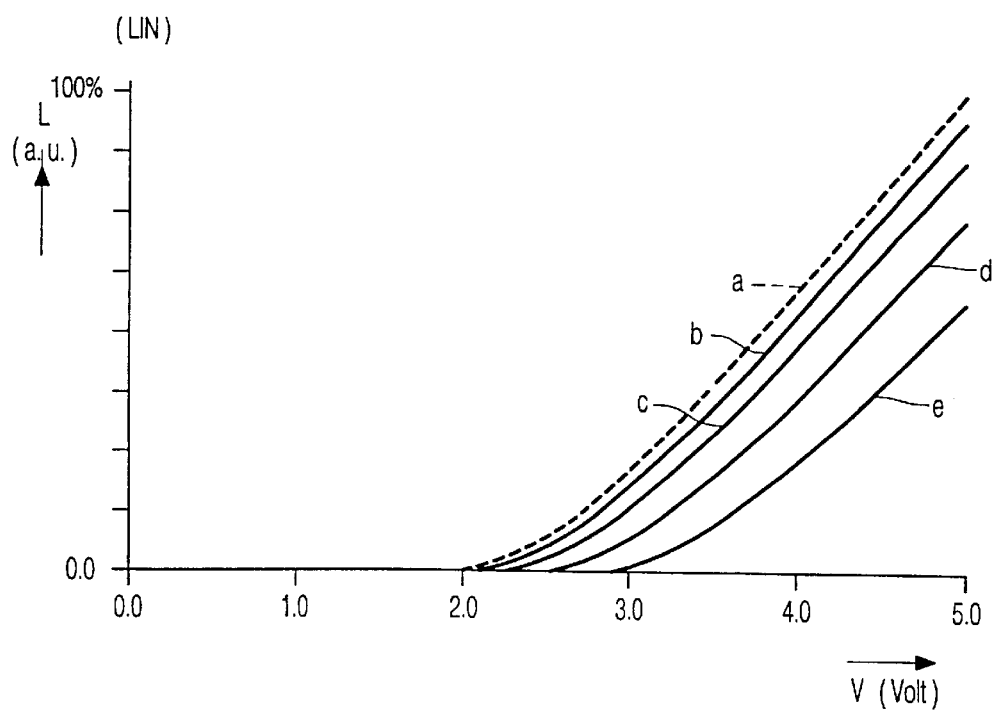
Figure 8:
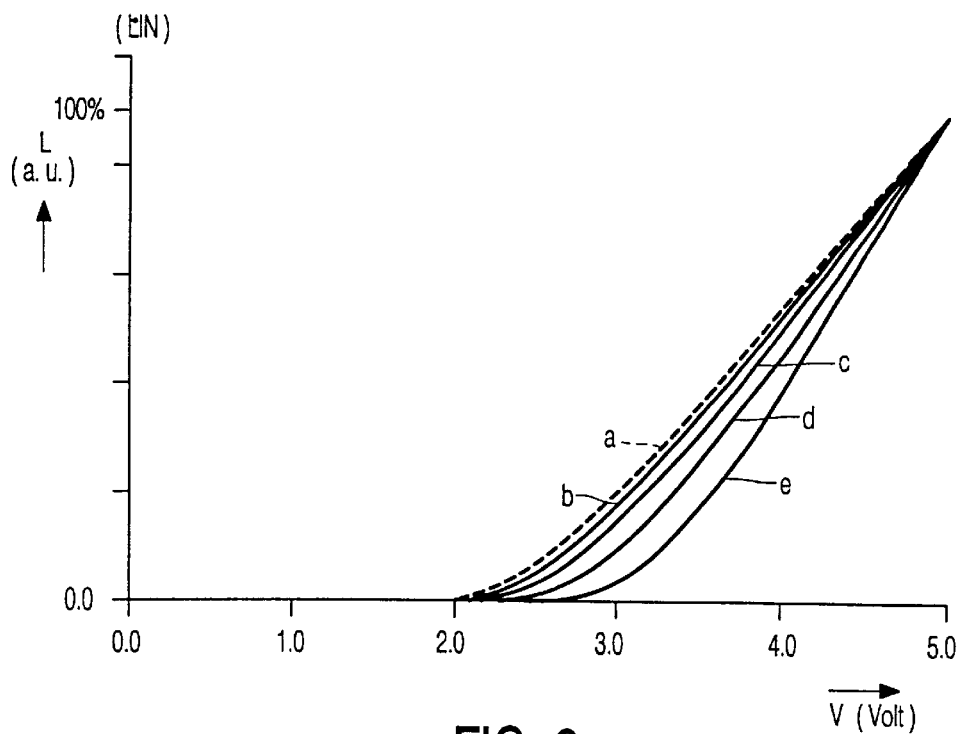

FIG. 6 is an equivalent circuit diagram of such a display device with five parallel-arranged LEDs $7^a$, $7^b$, $7^c$, $7^d$, $7^e$, provided with series resistors $13^a$, $13^b$, $13^c$, $13^e$ whose resistance increases again from left to right, and parallel resistors $18^a$, $18^b$, $18^c$, $18^d$, $18^e$. FIG. 7 shows the luminance/voltage characteristics a, b, c, d, e of each branch $15^a$, $15^b$, $15_c$, $15^d$, $15^e$. Due to the presence of the parallel resistors 18, the LEDs $7^a$, $7^b$, $7^c$, $7^d$, $7^e$ light up from threshold voltages $V'^a_{th}$, $V'^b_{th}$ ... $V'^c_{th}$ which are different for each LED. Now, an optical filter is not necessary to cause the LEDs 7 to light up separately. An optical filter 17 having different optical properties is suitable for causing the luminance/voltage characteristics a, b, c, d, e of each branch $15^a$, $15^b$, $15^c$, $15^d$, $15^e$ to converge to one and the same point (FIG. 8) so that at a higher voltage (charged battery in the above-mentioned example) all LEDs have the same luminance. The optical filter may be chosen to be such that all LEDs $7^a$, $7^b$, $7^c$, $7^d$, $7_e$ have the same luminance at one and the same voltage (5 V in this example).

The display device shown in FIGS. 3, 4 operates from a threshold voltage from about 2 volts, with the LEDs consecutively switching on between 2 volts and 2.8 volts. This "switch-on path" can be extended and, if necessary, moved by the voltage to be measured via a voltage divider. The voltage divider may form part of the complete display device. At high battery voltages, the current through the LEDs then remains limited, which increases the lifetime. If necessary, lower voltages (for example, output voltages of an amplifier) may be increased via a DC/DC converter.

Figure 9:
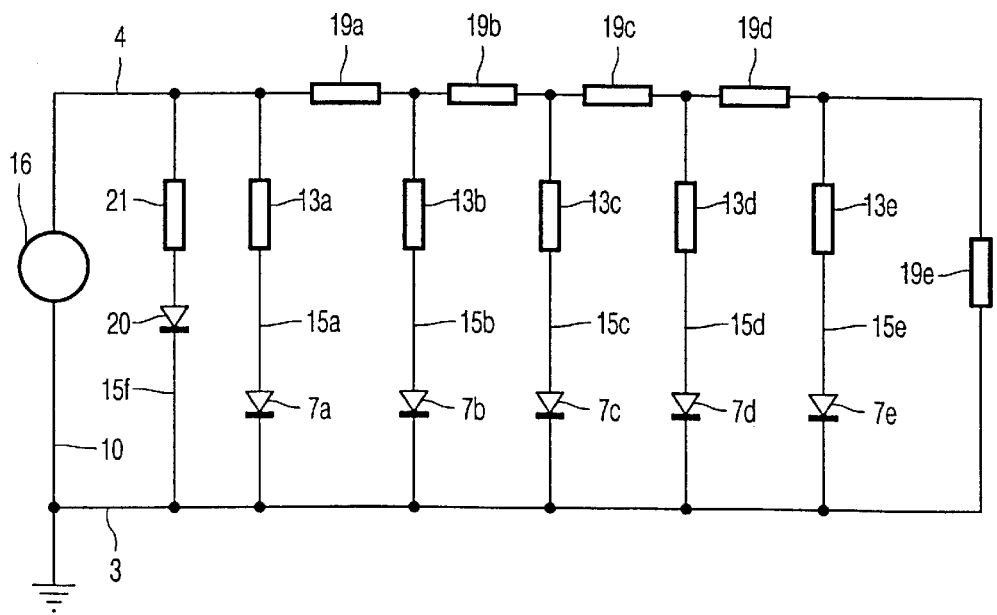
FIG. 9 is an equivalent circuit diagram of another display device according to the invention.
Figure 10:
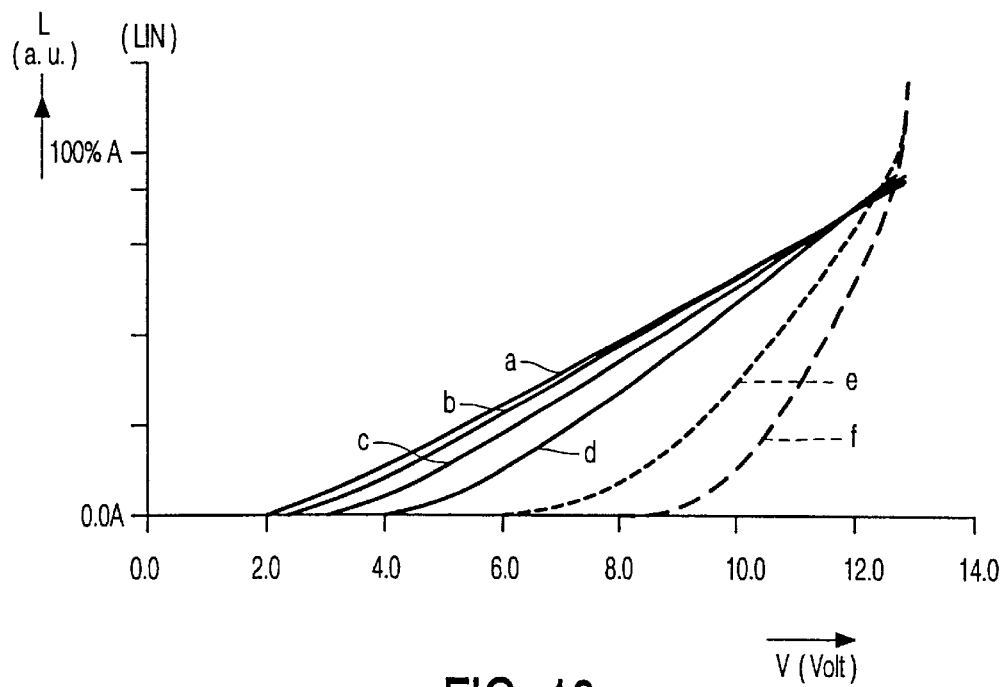

FIG. 9 shows a variant of the display device of FIG. 3, in which resistors $19^a$, $19^b$, $19^c$, $19^d$ are present between the branches 15, whose resistance increases again from left to right (and an extra resistor $19^e$). The resistors 19 are obtained by dimensioning the electrode layer 3. FIG. 10 shows the luminance/voltage characteristics a, b, c, d, e of each branch 15. Due to the presence of the resistors 19, the LEDs consecutively switch on between 2 volts and 6 volts so that the "switch-on path" is extended.

The display device shown in FIG. 9 also has an extra branch $15^f$ with a series resistor 21 and a diode 20 having a high threshold voltage. This can be achieved by making use of an extra (external) diode. In this way, the voltage across the LEDs is limited to approximately 12 volts (curve f in FIG. 10). The maximum current through the LEDs 7 is thereby limited in favor of the lifetime.

Figure 11:
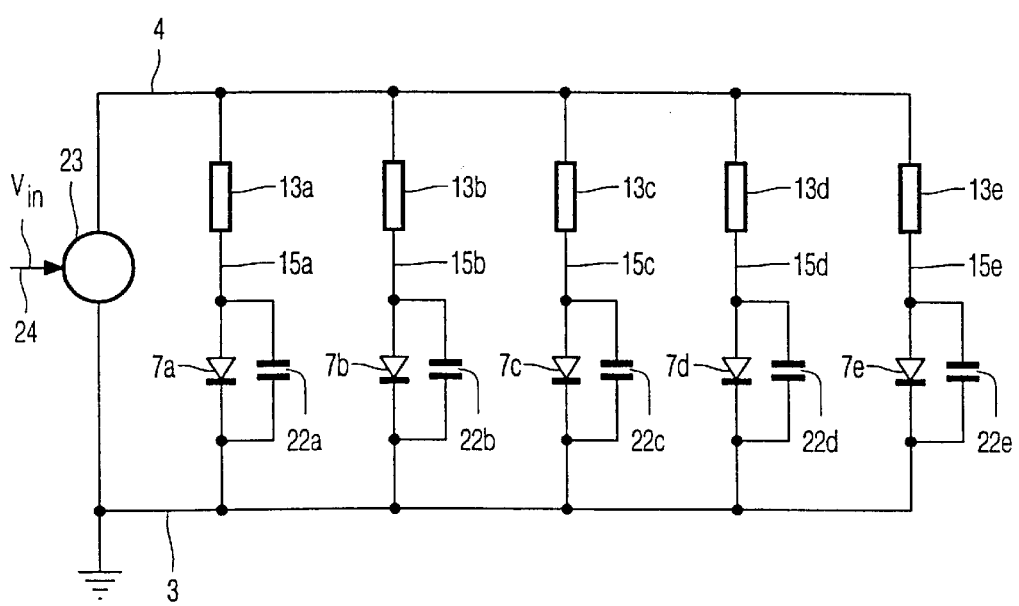
FIG. 11 is an equivalent circuit diagram of another display device according to the invention.
Figure 12:
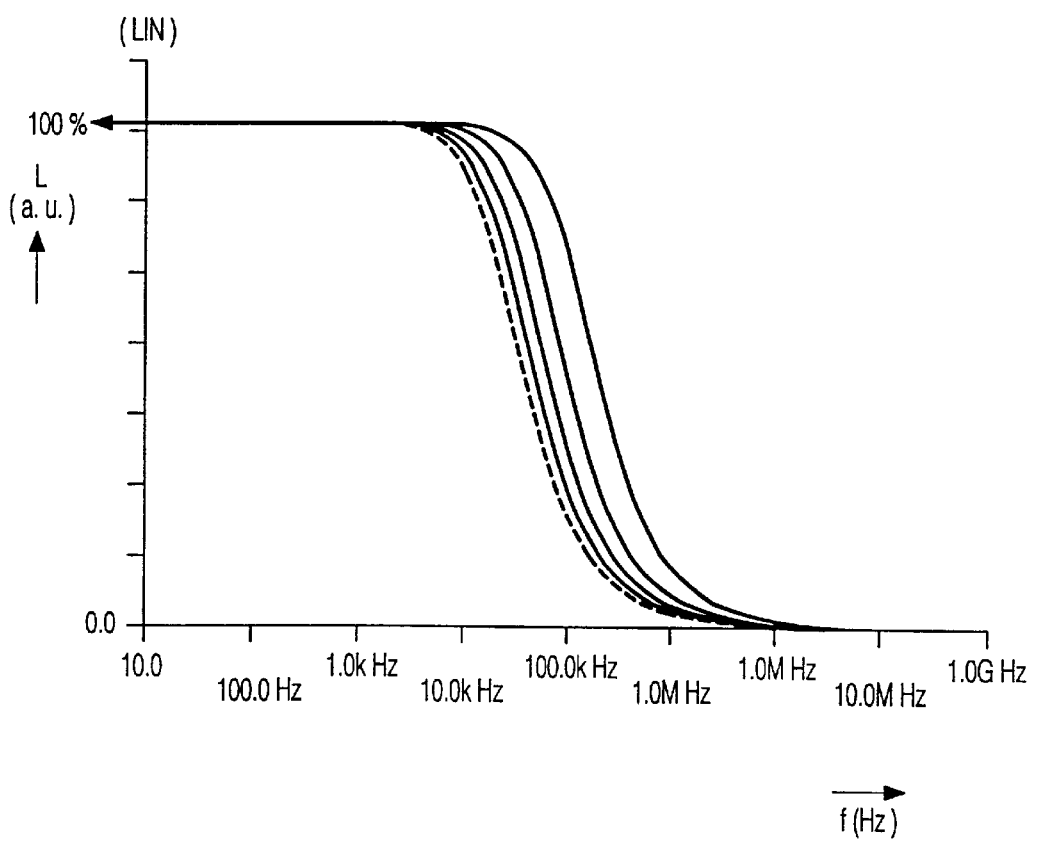
FIG. 12 shows luminance/frequency characteristics of the electroluminescent diodes in FIG. 11.

The LEDs 7 have an inherent capacitance 22 (FIG. 11) (natural capacitance). Due to the difference in resistances of the multiplier resistors (series resistors) $13^a$, $13^b$, $13^c$, $13^d$, $13^e$, each branch 15 has a different cut-off frequency. The display device is now driven by means of a voltage-controlled oscillator 23 whose output frequency is dependent on the voltage $V_{in}$. FIG. 12 shows how the current and hence the luminance in the different branches 15 (and hence in the LEDs 7) decreases with an increasing frequency. Each branch has a different cut-off frequency corresponding to a different threshold voltage at the input 24. With a decreasing voltage $V_{in}$, the supplied frequency decreases in this example, but the display device may also be adapted in such a way that this frequency increases.

The invention is of course not limited to the examples shown, but several variations are possible within the scope of the invention. For example, an optical filter may be used again in the display device of FIG. 9, which simplifies the dimensioning of the resistors. The multiplier resistors 13 may be alternatively realized between the LEDs 7 and the connection 3.

In summary, the invention relates to an integrated voltage level indicator comprising a plurality of polymer LEDs between two connection points, with the number and/or intensity of the light emitted by the LEDs being determined by an electric voltage supplied to the connection points.

The invention resides in each new characteristic feature and any combination of characteristic features.

What is claimed is:

1. A display device comprising a plurality of electroluminescent diodes and means for causing one or more of the diodes to luminesce in dependence upon a voltage to be supplied between two connection points, characterized in that at least the electroluminescent diodes are integrated in one semiconductor body, characterized in that the electroluminescent diodes are arranged in respective parallel branches and are provided with respective series resistors having mutually different resistance values in each of the parallel branches.

2. A display device comprising a plurality of electroluminescent diodes and means for causing one or more of the diodes to luminesce in dependence upon a voltage to be supplied between two connection points, characterized in that at least the electroluminescent diodes are integrated in one semiconductor body, characterized in that the electroluminescent diodes are arranged in respective parallel branches and are provided with respective series resistors having mutually different resistance values in each of the parallel branches, and further characterized in that said display device comprises a respective parallel resistor arranged parallel to each of the electroluminescent diodes in the respective parallel branches.

3. A display device comprising a plurality of electroluminescent diodes and means for causing one or more of the diodes to luminesce in dependence upon a voltage to be supplied between two connection points, characterized in that at least the electroluminescent diodes are integrated in one semiconductor body, characterized in that the electroluminescent diodes are arranged in respective parallel branches and are provided with respective series resistors having mutually different resistance values in each of the parallel branches, and further characterized in that the display device comprises a voltage divider arranged between said two connection points.

4. A display device comprising a plurality of electroluminescent diodes and means for causing one or more of the diodes to luminesce in dependence upon a voltage to be supplied between two connection points, characterized in that at least the electroluminescent diodes are integrated in one semiconductor body, characterized in that the electroluminescent diodes are arranged in respective parallel branches and are provided with respective series resistors having mutually different resistance values in each of the parallel branches, and further characterized in that the display device comprises a voltage-controlled oscillator arranged between said two connection points.

5. A display device comprising a plurality of electroluminescent diodes and means for causing one or more of the diodes to luminesce in dependence upon a voltage to be supplied between two connection points, characterized in that at least the electroluminescent diodes are integrated in one semiconductor body, characterized in that the electroluminescent diodes are arranged in respective parallel branches and are provided with respective series resistors having mutually different resistance values in each of the parallel branches, and further characterized in that the series resistors are integrated in the semiconductor body.

6. A display device comprising a plurality of electroluminescent diodes and means for causing one or more of the diodes to luminesce in dependence upon a voltage to be supplied between two connection points, characterized in that at least the electroluminescent diodes are integrated in one semiconductor body, characterized in that the electroluminescent diodes are arranged in respective parallel branches and are provided with respective series resistors having mutually different resistance values in each of the parallel branches, and further characterized in that the display device comprises a single diode having a steeper current/voltage characteristic than the electroluminescent diodes, and a single resistor in series with said single diode, being arranged between said two connection points.

7. A display device comprising a plurality of electroluminescent diodes and means for causing one or more of the diodes to luminesce in dependence upon a voltage to be supplied between two connection points, characterized in that at least the electroluminescent diodes are integrated in one semiconductor body, characterized in that the electroluminescent diodes are arranged in respective parallel branches and are provided with respective series resistors having mutually different resistance values in each of the parallel branches, and further characterized in that the series resistors are integrated in the semiconductor body, and additionally characterized in that the display device comprises an optical fiber.

* * * * *